United States Patent
Hendricks et al.

(10) Patent No.: US 6,232,900 B1
(45) Date of Patent: May 15, 2001

(54) SECOND ORDER DIGITAL FILTER REQUIRING ONLY ONE SIGMA DELTA MODULATOR

(75) Inventors: Paul D. Hendricks, Coopersburg; Lane A. Smith, Easton, both of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/299,089

(22) Filed: Apr. 26, 1999

Related U.S. Application Data

(60) Provisional application No. 60/074,217, filed on Feb. 10, 1998.

(51) Int. Cl.$^7$ ....................................................... H03M 3/00
(52) U.S. Cl. ............................ 341/143; 341/118; 341/120
(58) Field of Search ..................................... 341/120, 143, 341/144, 118, 155

(56) References Cited

U.S. PATENT DOCUMENTS

| | | | |
|---|---|---|---|
| 4,943,807 | * 7/1990 | Early et al. | ............................ 341/143 |
| 5,392,039 | * 2/1995 | Thurston | .............................. 341/143 |
| 5,457,456 | 10/1995 | Norsworthy | ............................ 341/61 |
| 5,757,300 | * 5/1998 | Koilpillai et al. | .................... 341/143 |
| 5,896,101 | * 4/1999 | Melanson | .............................. 341/143 |

\* cited by examiner

Primary Examiner—Michael Tokar
Assistant Examiner—Jean Bruner Jeanglaude
(74) Attorney, Agent, or Firm—William H. Bollman

(57) ABSTRACT

A $2^{nd}$ order digital filter requiring only one sigma delta modulator is created by implementing (1) a $2^{nd}$ order feedforward term created by the cascade of two $1^{st}$ order elements; (2) a $2^{nd}$ order feedback term created by the cascade of two $1^{st}$ order elements; and (3) another $2^{nd}$ order feedback term created by the cascade of two more $1^{st}$ order elements to eliminate the need for another sigma delta modulator to provide a $2^{nd}$ order filter. Thus, for the mere 'cost' of additional feedback loops, which are small in comparison with the size and complexity of another sigma delta modulator, a second sigma delta modulator is not necessary to implement a $2^{nd}$ order digital filter in accordance with the principles with the present invention.

20 Claims, 7 Drawing Sheets

FIRST-ORDER IIR FILTER

FIRST-ORDER INTEGRATOR-BASED IIR FILTER

BIQUAD ΣΔ-BASED IIR FILTER

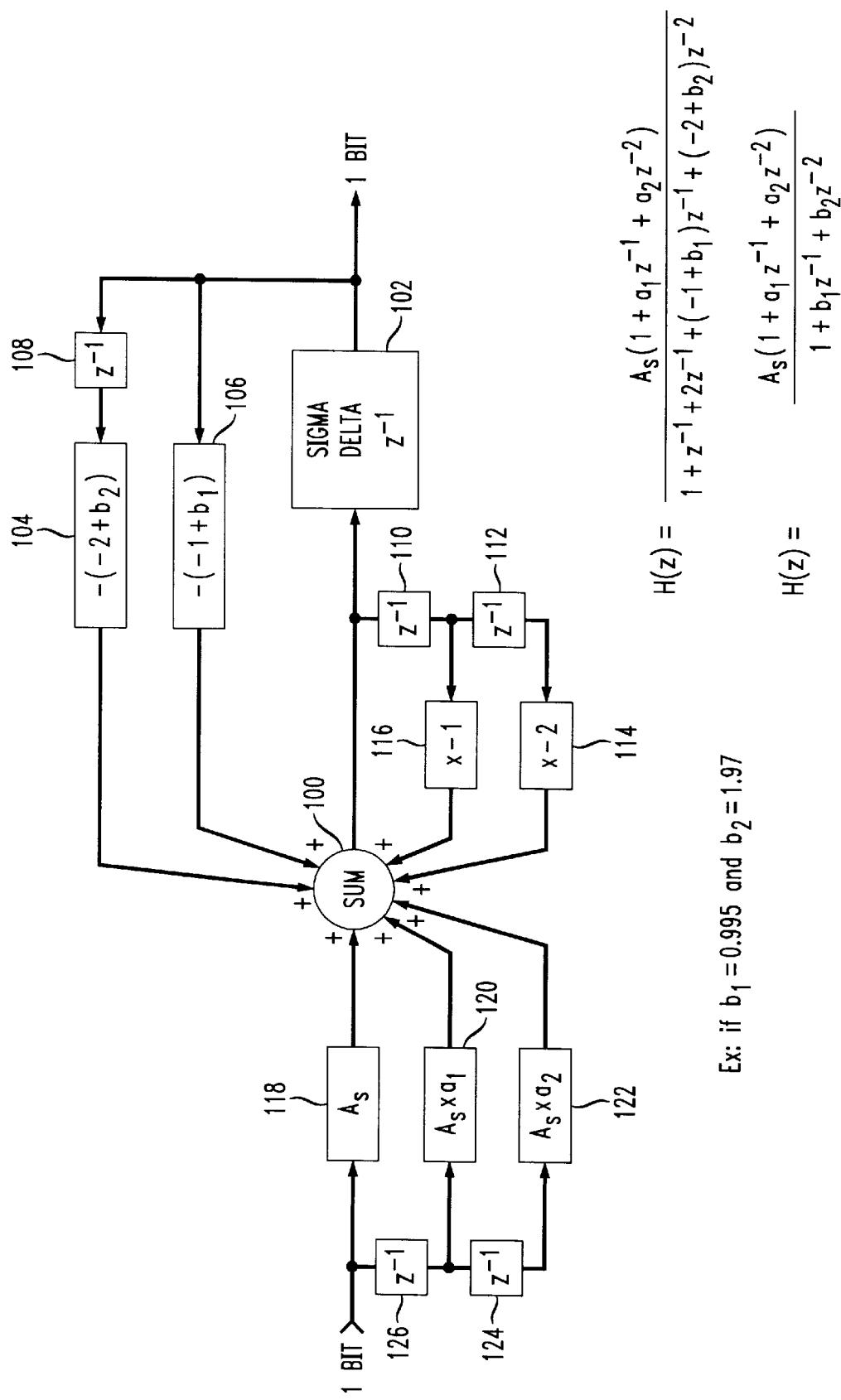

SECOND ORDER DIGITAL FILTER REQUIRING ONLY ONE SIGMA DELTA MODULATOR

The present application is related to U.S. application Ser. No. 09/027,912, filed Feb. 23, 1998, entitled "Recursive Digital Filter With Reset", which claims priority from U.S. Provisional Application No. 60/074,217 filed Feb. 10, 1998, and which has a common inventor herewith. The specifications of these applications in their entirety, including their respective drawings, are explicitly incorporated herein by reference.

BACKGROUND OF THE INVENTION

This invention relates generally to digital filtering. More particularly, it relates to the design of an efficient sigma delta gain/scaler performing second order filtering with only one sigma delta modulator.

Single bit (i.e., 1-bit) analog-to-digital (A/D) converters which output a single bit value have become very popular, particularly in voice and audio circuit design applications. Single bit A/D converters allow analog circuitry to be relatively simple with high circuit tolerances. Sigma delta techniques are common single bit data processing techniques utilizing oversampling. Generally, oversampling is the digital sampling of an input signal at a much higher rate than a Nyquist minimum rate.

FIG. 1 shows an exemplary single bit A/D converter circuit including a 1-bit A/D converter 3002, a digital decimation filter 3004, and additional post filtering 3006.

In particular, the single bit output of the 1-bit A/D converter 3002 is typically decimated by a digital decimation filter (or simply "decimator") 3004. The decimator 3004 is a type of digital filter which converts a single bit stream occurring at the high (i.e., oversampled) sampling rate into a multi-bit signal (e.g., m bit signal as shown in FIG. 1) occurring, e.g., at the Nyquist rate. Post processing of the low rate, high resolution multi-bit output signal can be performed by post filtering circuitry 3006, e.g., using dedicated hardware filters or a programmable digital signal processor (DSP).

Applications exist in which it is more desirable to process the input signal at the oversampled rate than it is to decimate the single bit signal down to a lower rate, multi-bit signal and then perform post filter signal processing.

For example, FIG. 2 shows a mixing of two separate single bit data streams 3108, 3109 in, e.g., a sigma delta single bit mixer 3104, before being digitized by an appropriate digital-to-analog (D/A) converter 3106.

In particular, in FIG. 2, multiple single bit data streams 3108, 3109 can be mixed together at an oversampled rate in a single bit mixer, e.g., in sigma delta mixer 3104, with the single bit output of the sigma delta mixer 3104 representing a composite of the input single bit data streams 3108, 3109. It may then be desirable to convert this mixed, single bit output stream 3111 into an analog signal 3112 using an appropriate single bit digital-to-analog (D/A) converter 3106.

FIG. 3 shows another application exemplifying the ability to do in-band filtering at an oversampled rate.

In particular, as shown in FIG. 3, early work in this field has shown that it is practical to implement $1^{st}$ order filter transfer functions using sigma delta modulators. In this case, it has been shown that a $1^{st}$ order filter function was implemented using a classical $2^{nd}$ order modulator with a $z^{-1}$ delay. A $2^{nd}$ order transfer function can be formed by cascading two $1^{st}$ order systems, each comprising a sigma delta modulator with a delay of $z^{-1}$.

Unfortunately, each sigma delta modulator requires a significant amount of area on an integrated circuit, increasing the size of the overall circuit for each $1^{st}$ order block added.

Accordingly, there is a need for a more efficient construction for a $2^{nd}$ order digital filter.

SUMMARY OF THE INVENTION

In accordance with the principles of the present invention, a single bit digital filter comprises a sigma delta modulator. A first $1^{st}$ order feedback term is connected to an output of the sigma delta modulator. A delay element delays the first $1^{st}$ order feedback term. A summer sums the delayed first $1^{st}$ order feedback term with a signal being input to the sigma delta modulator.

A method of providing a $2^{nd}$ or higher order single bit digital filter using only one sigma delta modulator in accordance with another aspect of the present invention comprises generating a modulated signal with one sigma delta modulator. A sample output from the sigma delta modulator is delayed for one filter cycle. The delayed sample output from the one sigma delta modulator is summed with an input signal to the sigma delta modulator. A $2^{nd}$ order denominator portion of a transfer function is output by the one sigma delta modulator.

BRIEF DESCRIPTION OF THE DRAWINGS

Features and advantages of the present invention will become apparent to those skilled in the art from the following description with reference to the drawings, in which:

FIG. 7 shows a general depiction of a $2^{nd}$ order single bit digital filter in accordance with the principles of the present invention.

DETAILED DESCRIPTION OF ILLUSTRATIVE EMBODIMENTS

The present invention provides a $2^{nd}$ order filter using only one sigma delta modulator having a delay of $z^{-1}$, rather than requiring two sigma delta modulators as in conventional $2^{nd}$ order filters. One advantage of the present invention is the reduced size requirements of such a $2^{nd}$ order filter in comparison to conventional $2^{nd}$ order filters, since only one modulator is required.

In one embodiment, each input to a digital filter represents a scaled and delayed version of its previous input. In this case, each input to the digital filter represents an individual tap, and a scale factor for each individual tap is simply a register value. The register value is added or subtracted depending on the value of the single bit digital sample passing through the digital filter. The sigma delta modulator sums these inputs and converts the summation back into a single bit output.

Because the quantization noise curve rises fairly quickly for each order of a sigma delta modulator, high order FIR filters are preferred in such a scheme to perform baseband filtering.

As background to the invention, one approach to developing a $2^{nd}$ (or greater) order single bit digital filter is to implement fairly low order single bit (e.g., sigma delta) IIR sigma delta filters for baseband filtering. A conventional implementation of such low order sigma delta IIR filtering is the direct method, in which the single bit output of a $2^{nd}$ or higher order sigma delta modulator is directly multiplied with a coefficient representing the pole in the denominator of the relevant transfer function.

Figure 1:
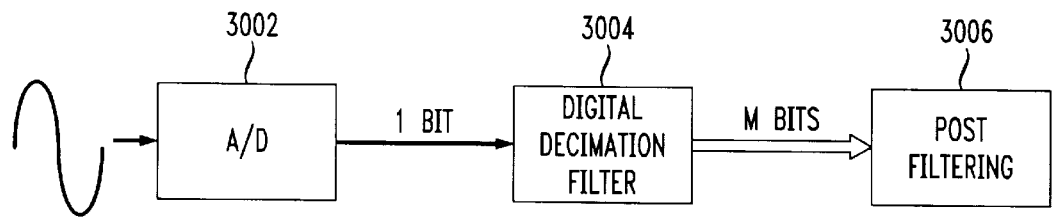
FIG. 1 shows an exemplary single bit A/D converter circuit including a 1-bit A/D converter, a digital decimation filter, and additional post filtering.
Figure 2:
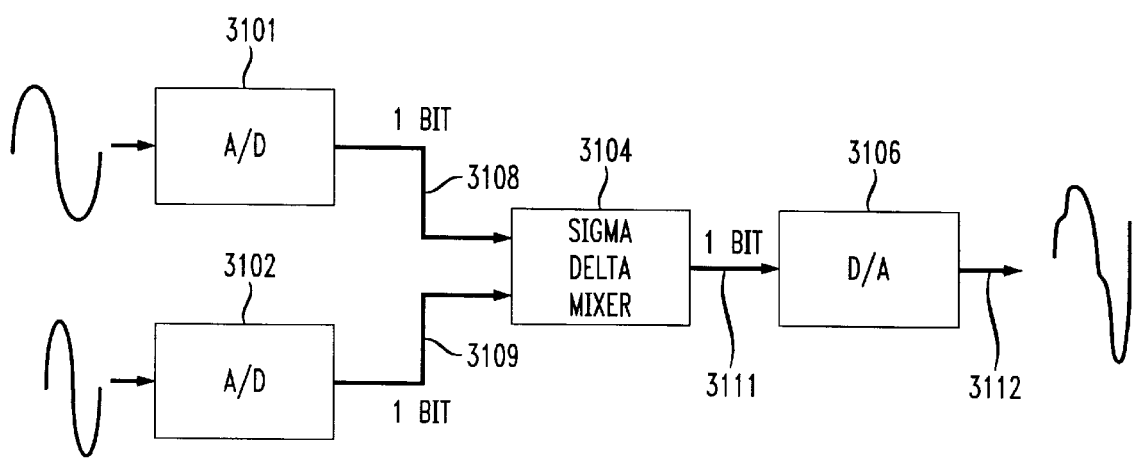
FIG. 2 shows a mixing of two separate single bit data streams in, e.g., a sigma delta single bit mixer, before being digitized by an appropriate digital-to-analog (D/A) converter.
Figure 3:
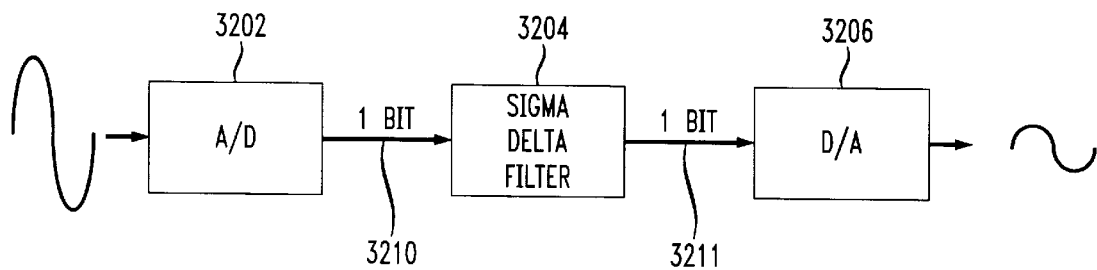
FIG. 3 shows another application exemplifying the ability to do in-band filtering at an oversampled rate.
Figure 4:
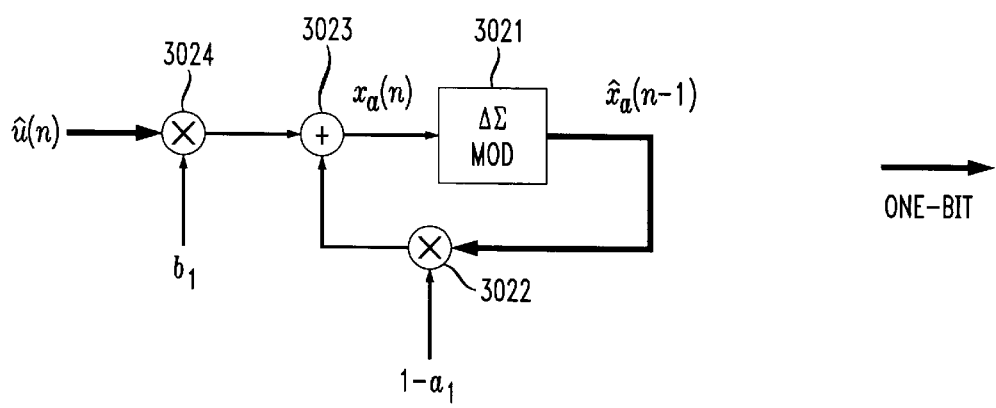
FIG. 4 shows a conventional $1^{st}$ order IIR filter.
Figure 5:
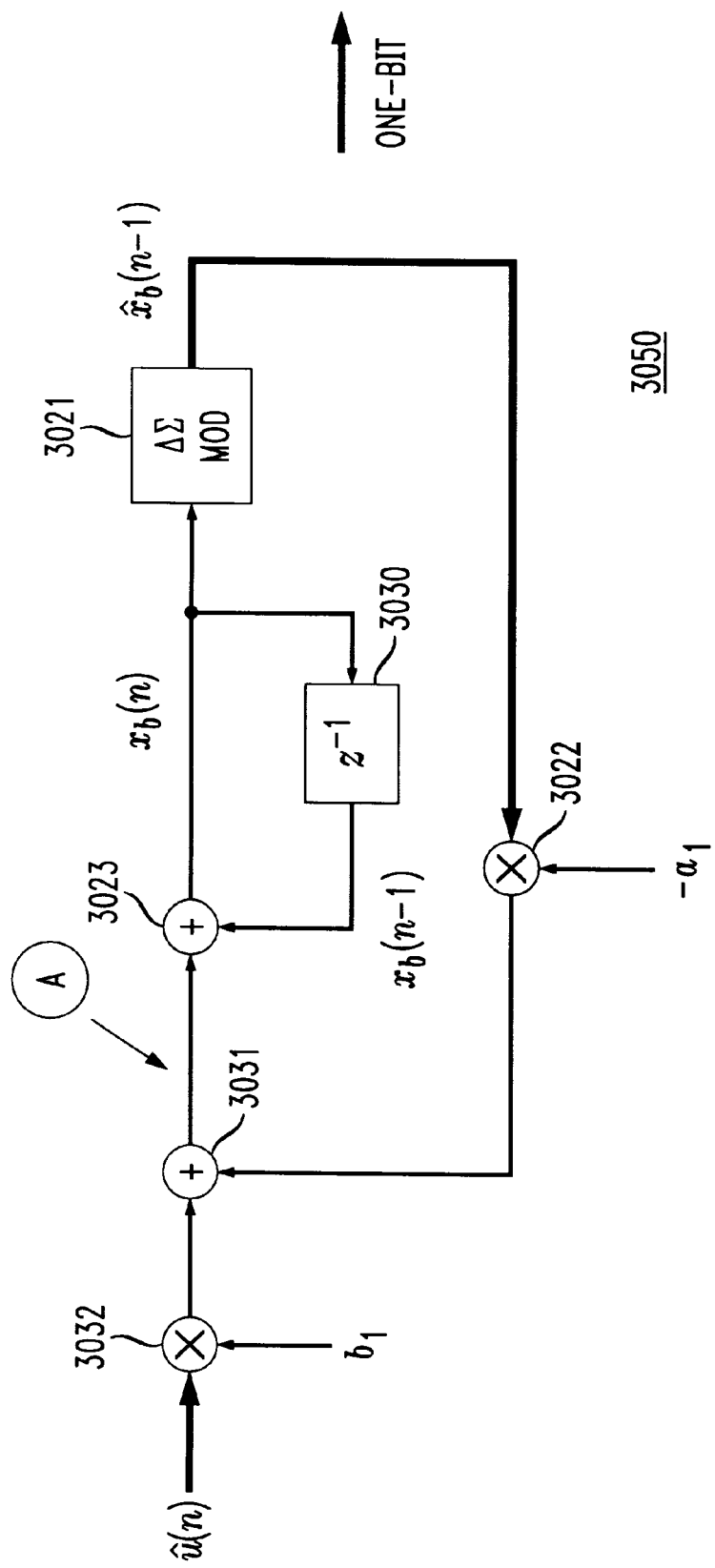
FIG. 5 shows a conventional $1^{st}$ order integrator-based IIR filter.
Figure 6:
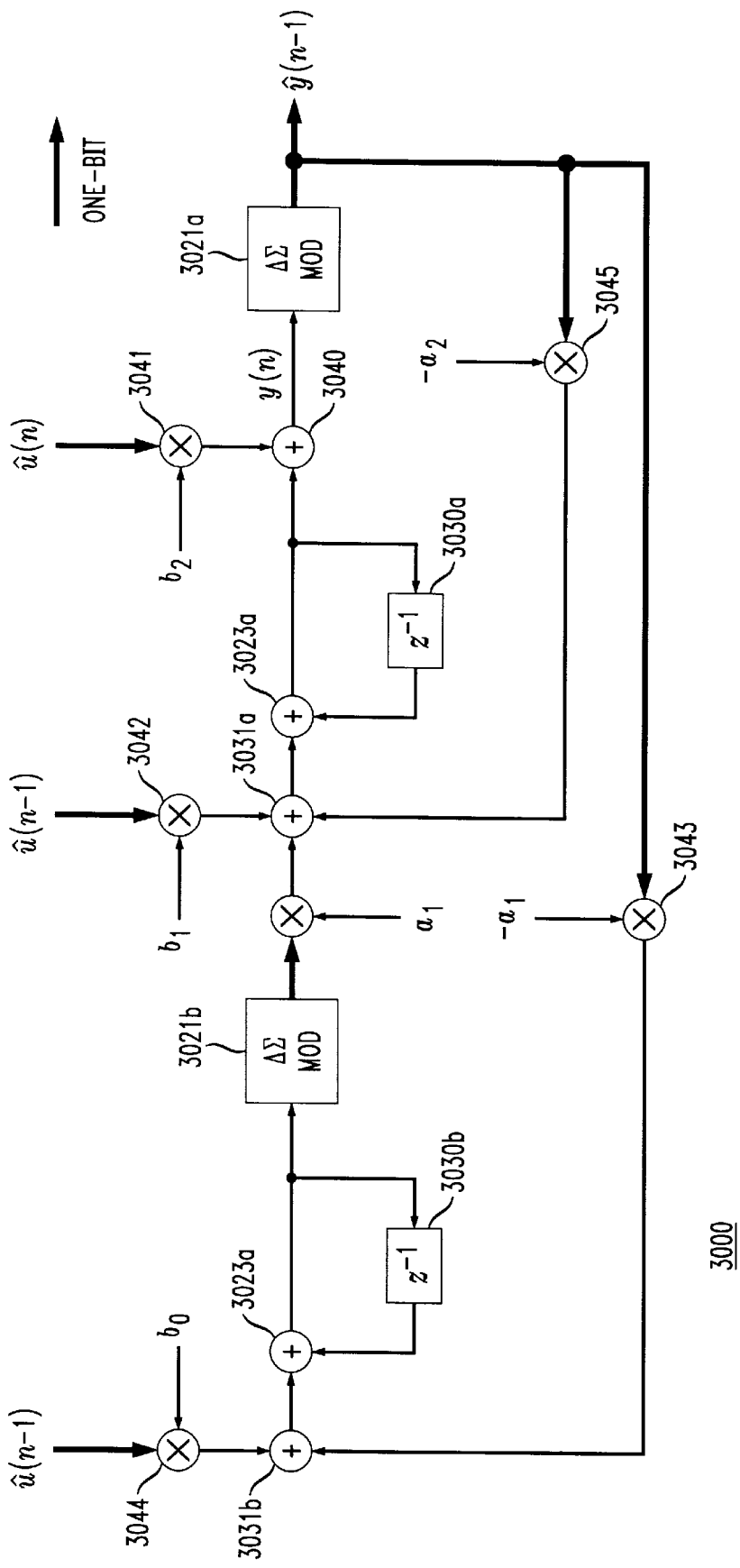
FIG. 6 shows an extension of the conventional implementations of a $1^{st}$ order IIR filter shown in FIGS. 4 and 5 by cascading two $1^{st}$ order sections as shown in FIGS. 4 and 5 to produce a conventional $2^{nd}$ order biquad sigma delta based IIR filter.

For instance, as shown in FIGS. 4–6 a first order integrator structure is known in which the denominator pole can be arranged such that only a portion of the noise gain is injected into a $2^{nd}$ or higher order modulator. FIG. 4 shows such a conventional $1^{st}$ order IIR filter, and FIG. 5 shows a $1^{st}$ order integrator-based IIR filter constructed in accordance with this conventional technique.

In particular, a $1^{st}$ order transfer function can be described by the equation:

$$T(z) = \frac{b_1}{1 - (1 - a_1)z^{-1}}$$

For oversampled transfer functions, $a_1$ and $b_1$ are close to zero. A direct form of such a conventional $1^{st}$ order transfer function for a $1^{st}$ order IIR filter is shown in FIG. 4.

In FIG. 4, an input signal u(n) is multiplied by the numerator coefficient b1 in multiplier 3024, and then added in summer 3023 to a feedback term $(1-a_1)$ after delay in a sigma delta modulator 3021, resulting in a denominator $(1-a_1)z^{-1}$ as in the desired $1^{st}$ order transfer function.

Conventional implementation of the $1^{st}$ order transfer function into a $1^{st}$ order integrator-based IIR filter is shown in FIG. 5. The multibit signal at node A takes on only one of four possible values.

In FIG. 5, two terms in the denominator are formed by two feedback loops. A first term is formed by a delay loop comprising a delay element 3030 resulting in the term $z^{-1}$. A second term is formed by a delay caused by the delta sigma modulator 3021, after the delay caused in the first feedback loop with delay element 3030, and by multiplication in a multiplier 3022.

Note in FIG. 5 that the noise injected at the delta sigma modulator 3021 has a much lower noise gain than that in the direct form structure shown in FIG. 4.

FIG. 6 shows a conventional extension of the conventional implementations of a $1^{st}$ order IIR filter shown in FIGS. 4 (direct method) and 5 (integrator based method) by cascading two $1^{st}$ order filter sections as shown in FIGS. 4 and 5 to produce a $2^{nd}$ order biquad sigma delta IIR filter. However, this conventional $2^{nd}$ order sigma delta IIR filter requires two sigma delta modulators 3021a, 3021b, each introducing a delay.

In particular, the biquad sigma delta IIR filter shown in FIG. 6 is implemented using a cascade of two sigma delta modulators 3021a, 3021b, each having a delay of $z^{-1}$. Of course, in cascading the two separate $1^{st}$ order IIR filter sections to form the single biquad sigma delta IIR filter 3000, some adders otherwise shown in FIG. 5 are not required. In general, 3.5×N adders are required for an Nth order sigma delta IIR filter.

One of the disadvantages of the biquad sigma delta IIR filter 3000 shown in FIG. 6 is that two $2^{nd}$ order sigma delta modulators are required to implement the $2^{nd}$ order transfer function of the $2^{nd}$ order IIR filter.

An inventive method for implementing a $2^{nd}$ order filter transfer function has been devised requiring only one sigma delta modulator instead of the two sigma delta modulators otherwise required using conventional techniques. By eliminating one of the sigma delta modulators, significant area savings can result, albeit depending upon the number of bits of resolution needed to represent the filter taps.

FIG. 7 shows an embodiment of a $2^{nd}$ order single bit digital filter requiring only one sigma delta modulator in accordance with the principles of the present invention. The disclosed embodiment of a $2^{nd}$ order digital filter shown in FIG. 7 inputs single or multi-bit data samples, and outputs single bit oversampled data samples.

In particular, in FIG. 7, a $2^{nd}$ order filter has been implemented using only one sigma delta modulator, whereas conventional implementations of a $2^{nd}$ order digital filter typically require a cascading of two $1^{st}$ order sections, each containing a sigma delta modulator. As a result, the second sigma delta modulator (which otherwise requires a significant amount of space in an integrated circuit) is eliminated, thus achieving a more cost effective implementation.

In FIG. 7, the numerator or feedforward terms consist of registers containing the product of the scale factor $A_s$, and the coefficients 1, $a_1$ and $a_2$. These feedforward register values would either be added or subtracted at the input summing node depending on the present and past values of the single bit input. This can be implemented using a simple adder/subtractor.

The denominator or feedback terms 1, $b_1$, and $b_2$ are implemented in the following manor. Only a portion of the feedback coefficients $-(1-b_1)$ or $-(2-b_1)$ . . . and $-(1-b_2)$ or $-(2-b_2)$ . . . are passed through the single sigma delta modulator.

The sigma delta filter 102 is designed with a delay of $z^{-1}$. For the $z^{-1}$ term in the denominator, the single bit modulator output is multiplied by $-(1-b_1)$ or $-(2-b_1)$ . . . and added to the input summing node. Similarly, for the $z^{-2}$ term, the portion $-(1-b_2)$ or $-(2-b_2)$ is multiplied by a delayed $z^{-1}$ version of the output of the single bit sigma delta modulator. As with the feedforward terms, this multiplication is performed by simply adding or subtracting register values which contain the partial feedback coefficients $(1-b_1)$ or $(2-b_1)$ . . . and $(1-b_2)$ or $(2-b_2)$ . . . . The remaining portion of the denominator coefficients, $z^{-1}$ or $2z^{-1}$ . . . and $z^{-2}$ or $2z^{-2}$ . . . are fed back and added at the input summing node prior to going through the sigma delta modulator 102. Since they would be multiplied by a factor of +/-1, or +/-2, or +/-4, . . . , this would be accomplished by a simple shift and/or complement.

Thus, a $2^{nd}$ order filter is created requiring only one sigma delta modulator by implementing (1) a $2^{nd}$ order feedforward term 122, 124 created by the cascade of two $1^{st}$ order elements 124, 126; (2) a $2^{nd}$ order feedback term 112, 114 created by the cascade of two $1^{st}$ order elements 110, 112; and (3) another $2^{nd}$ order feedback term 104, 108 created by the cascade of two $1^{st}$ order elements 102, 108, to eliminate the need for another sigma delta modulator to provide a $2^{nd}$ order filter. Therefore, for the mere 'cost' of additional feedback loops, which are small in comparison with the size and complexity of another sigma delta modulator, a second sigma delta modulator is not necessary to implement a $2^{nd}$ order digital filter in accordance with the principles of the present invention.

Figure 8A:
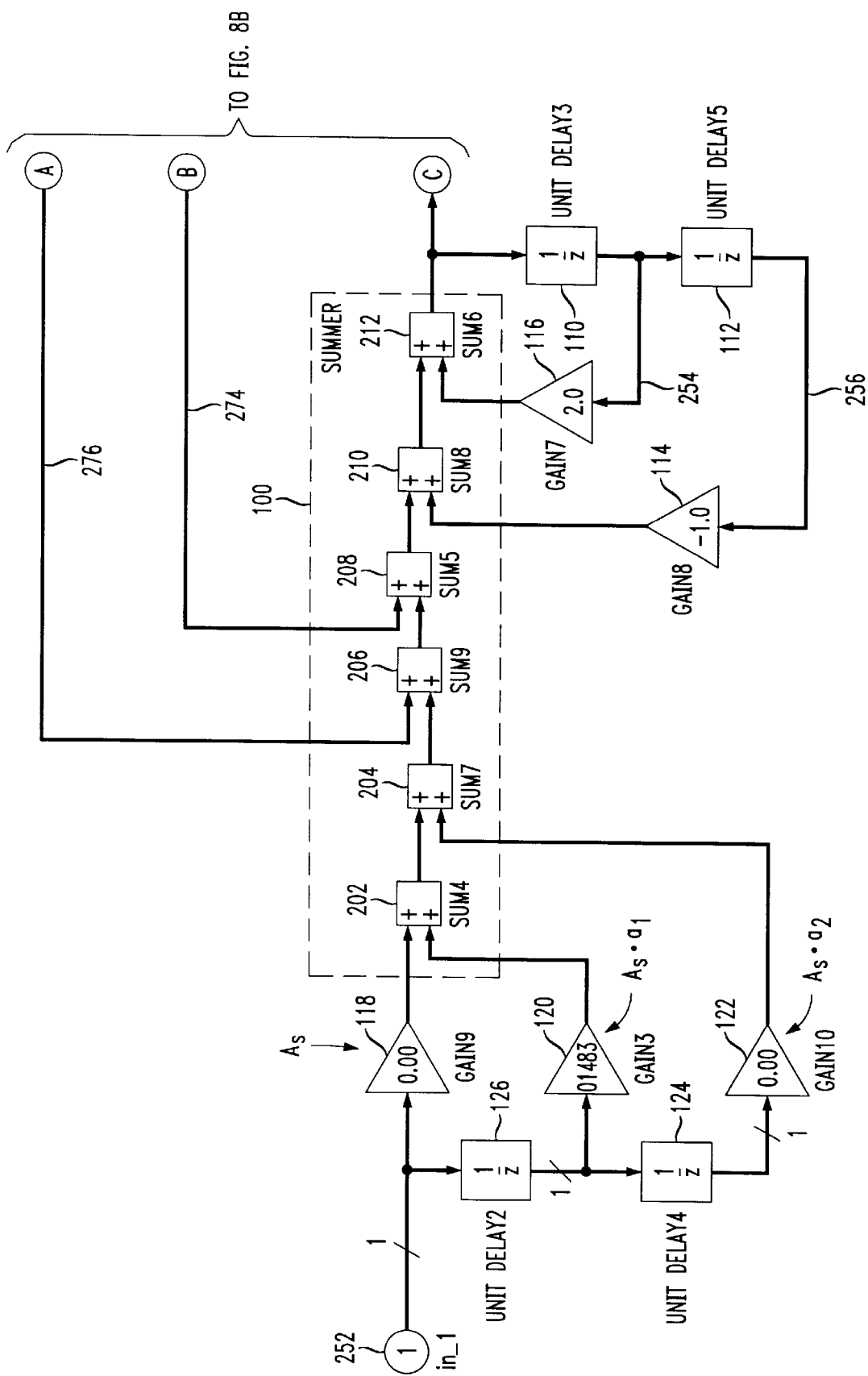
FIG. 8 shows a specific, real world implementation of the use of only one sigma delta modulator to provide a $2^{nd}$ order IIR filter, in accordance with the principles of the present invention.
Figure 8B:
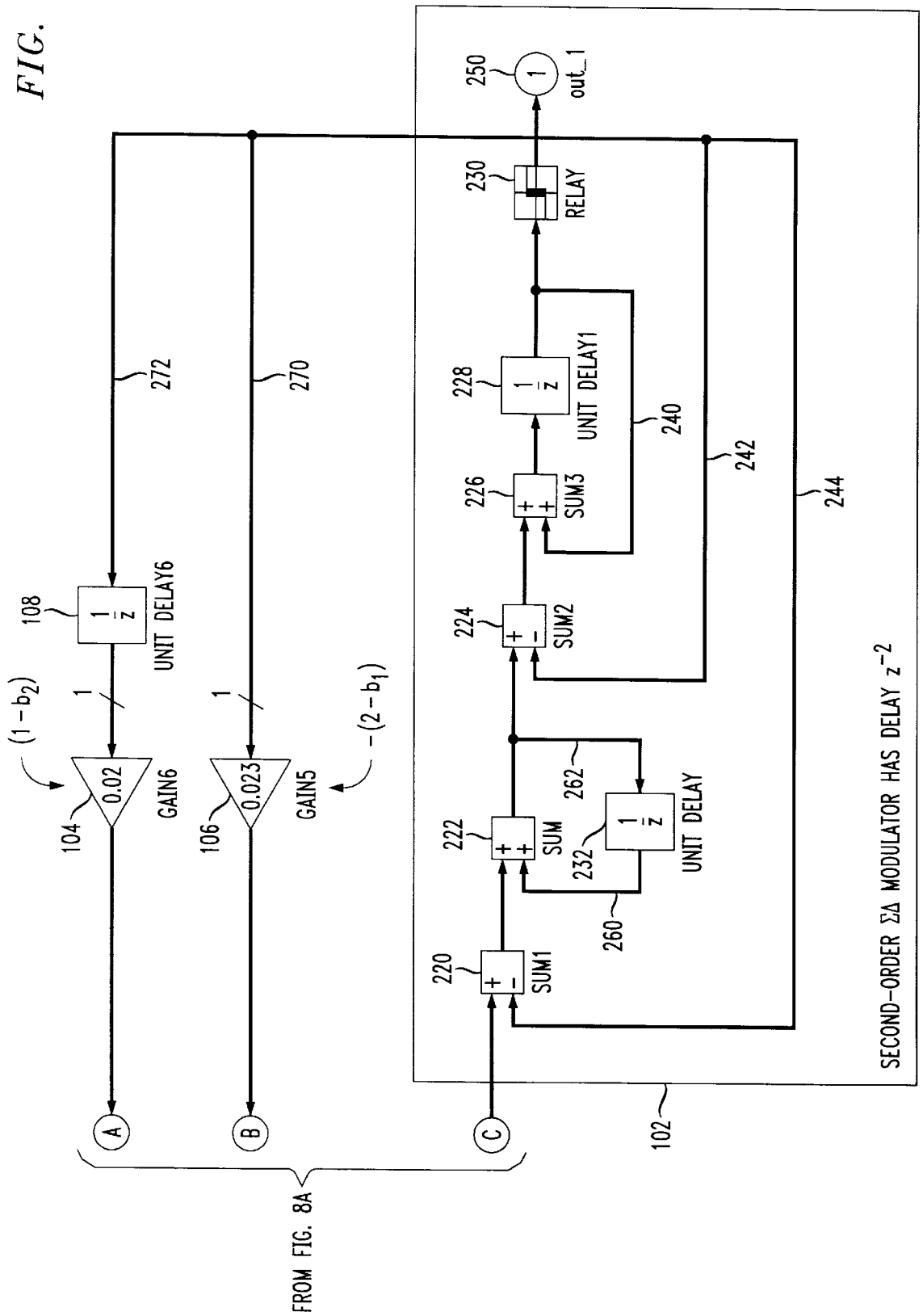

FIG. 8 shows a specific, real world implementation of the use of only one sigma delta modulator to provide a $2^{nd}$ order IIR filter, in accordance with the principles of the present invention.

In particular, in FIG. 8, the triangular symbol represents the multiplication of the input signal by the value assigned to that symbol. For example, if the symbol includes the designated value 0.028, then the input signal is thereby multiplied by 0.028 to arrive at an output value.

In reality, the values designated by the triangular symbols equate to the desired filter coefficients and their resulting partial coefficients. These values are then stored in a register representing each coefficient.

Since the input signal is a single bit with a logic HIGH value represented by, e.g., a '1' and a logic LOW signal represented by, e.g., a '−1', multiplication by the coefficients is performed by simply taking the complement of the register value when the input is at a logic LOW, and passing the un-complemented register value when the input is at a logic HIGH. This is shown in the following Table IV:

TABLE IV

| INPUT | REGISTER | OUTPUT |
|---|---|---|
| Logic HIGH | +X | +X |
| Logic LOW | +X | −X |

The transfer function of the digital filter can be obtained at the output of the two input adder SUM6, or at the output node OUT_(which is simply the output of adder SUM6 delayed by $z^{-1}$, i.e., the delay of the sigma delta modulator 102).

Developing the transfer function, the output of the two input adder SUM7 provides the following feedforward terms:

$$SUM7=(GAIN9 \times IN\_1)+(GAIN3 \times IN\_xz^{-1})+(GAIN10 \times IN\_xz^{-2})$$

Or, simplifying:

$$SUM7=IN\_1 \times (GAIN9+(GAIN3 \times z^{-1})+(GAIN10 \times z^{-2}))$$

Similarly, for the output of the adder SUM6:

$$SUM6=(SUM6 \times GAIN7 \times z^{-1})+(SUM6 \times GAIN8 \times z^{-2})+(SUM6 \times GAIN5 \times z^{-1})+(SUM6 \times GAIN6 \times z^{-2})+(SUM7)$$

Grouping terms:

$$SUM6 \times (1-GAIN7 \times z^{-1}-GAIN8 \times z^{-2}-GAIN5 \times z^{-1}-GAIN6 \times z^{-2})=SUM7=IN\_x(GAIN9+GAIN3 \times z^{-1}+GAIN10 \times z^{-2})$$

The output/input (SUM6/IN_1) is thus calculated as follows:

$$SUM6/IN\_1=(GAIN9+GAIN3 \times z^{-1}+GAIN10 \times z^{-2})/(1-(GAIN7 \times z^{-1})-(GAIN8 \times z^{-2})-(GAIN5 \times z^{-1})-(GAIN6 \times z^{-2}))$$

For the general case, GAIN9=1, and the numerator coefficients of the transfer function of the filter are:

GAIN3=coefficient $a_1$

GAIN10=coefficient $a_2$

If the filter has a gain of $A_s$, then each term in the numerator is scaled by the gain factor, and they now become:

GAIN9=$A_s$

GAIN3=$A_s \times a_1$

GAIN10=$A_s \times a_2$

In the denominator for the partial coefficients, GAIN5=$(1-b_1)$ and GAIN6=$(1-b_2)$, resulting in GAIN7=$-1$ and GAIN8=$-1$.

For the general case, the equation now becomes:

$$SUM6/IN\_1=A_s \times (1+a_1 \times z^{-1}+a_2 \times z^{-2})/(1+z^{-1}+z^{-2}-((1-b_1) \times z^{-1})-((1-b_2) \times z^{-1}))$$

Or, after simplification:

$$SUM6/IN\_1=A_s \times (1+a_1 \times z^{-1}+a_2 \times z^{-2})/(1+b_1 \times z^{-1}+b_2 \times z^{-1})$$

For example, in order to implement a low pass filter operating at 2.4576 MHz with a pass band attenuation at 10 KHz and a stop band attenuation at 80 KHz, the following transfer function is implemented in the digital filter shown in FIG. 8:

$$H(z)=0.00774 \times (1-1.9178 \times z^{-1}+0.9999 \times z^{-2})/(1-1.97173 \times z^{-1}+0.9724 \times z^{-2})$$

where $A_s$=0.00774, $a_1$=−1.9178, $a_2$=0.9999, $b_1$=−1.97173, and $b_2$=0.9724

The values for the various gain settings in this example are summarized in the following Table V:

TABLE V

| GAIN TERM | FORMULA | VALUE |
|---|---|---|
| GAIN9 | $A_S$ | 0.00774 |
| GAIN3 | $A_S \times a_1$ | −0.01484 |
| GAIN10 | $A_S \times a_2$ | 0.00774 |
| GAIN5 | $-(2 - b_1)$ | −0.02827 |
| GAIN6 | $(1 - b_2)$ | 0.02755 |
| GAIN7 | $-(GAIN5 + b_1)$ | 2 |
| GAIN8 | $(GAIN6 + b_2)$ | −1 |

Note that GAIN9, GAIN3, and GAIN10 are multiplied by the single bit input or a delayed version of the input, and are thus nothing more than a complemented or non-complemented version of the appropriate stored register value. Similarly, GAIN5 and GAIN6 are multiplied by the single bit output OUT_1, again resulting in the complemented or non-complemented version of the stored register value.

GAIN7 is determined by taking the value of the closest integer power of two value that is larger in magnitude than the absolute value of the coefficient $b_1$, with sign opposite the sign on $b_1$. Similarly, GAIN8 is determined using the coefficient $b_2$. Thus, implementing GAIN7 involves a simple shift of digital bits, whereas the implementation of GAIN8 involves a simple complement of the digital bits.

While the invention has been described with reference to embodiments using particular circuitry and/or particular logic levels, it is to be understood by those of skill in the art that the particular circuitry may be altered, implemented in software residing in a processor such as a microprocessor, microcontroller or digital signal processor, and/or the logic levels changed, to achieve the same results within the scope of the present invention.

While the invention has been described with reference to the exemplary embodiments thereof, those skilled in the art will be able to make various modifications to the described embodiments of the invention without departing from the true spirit and scope of the invention.

What is claimed is:

1. A $2^{nd}$ order digital filter, comprising:
   a single sigma delta modulator;
   a first $1^{st}$ order feedback term connected to an output of said single sigma delta modulator;
   a delay element to delay said first $1^{st}$ order feedback term; and
   a summer for summing said delayed first $1^{st}$ order feedback term with a signal being input to said single sigma delta modulator of said $2^{nd}$ order digital filter.

2. The digital filter according to claim 1, wherein:
   said single sigma delta modulator is at least a $2^{nd}$ order sigma delta modulator.

3. The $2^{nd}$ order digital filter according to claim 1, further comprising:
   a first $1^{st}$ order feedforward term connected between an input signal to said digital filter and said summer; and
   a second $1^{st}$ order feedforward term connected between said first $1^{st}$ order feedforward term and said summer;
   wherein said first $1^{st}$ order feedforward term and said second $1^{st}$ order feedforward term combine to provide a $1^{st}$ order feedforward term and a $2^{nd}$ order feedforward term.

4. A digital filter, comprising:
   a sigma delta modulator;
   a first $1^{st}$ order feedback term connected to an output of said sigma delta modulator;
   a delay element to delay said first $1^{st}$ order feedback term;
   a summer to sum said delayed first $1^{st}$ order feedback term with a signal being input to said sigma delta modulator;
   a second $1^{st}$ order feedback term connected between an input of said sigma delta modulator and said summer; and
   a third $1^{st}$ order feedback term connected between said second $1^{st}$ order feedback term and said summer;
   wherein said second $1^{st}$ order feedback term and said third $1^{st}$ order feedback term combine to provide a $1^{st}$ order feedback term and a $2^{nd}$ order feedback term.

5. A digital filter, comprising:
   a sigma delta modulator;
   a first $1^{st}$ order feedback term connected to an output of said sigma delta modulator;
   a delay element to delay said first $1^{st}$ order feedback term; and
   a summer to sum said delayed first $1^{st}$ order feedback term with a signal being input to said sigma delta modulator;
   a first $1^{st}$ order feedforward term connected between an input signal to said digital filter and said summer;
   a second $1^{st}$ order feedforward term connected between said first $1^{st}$ order feedforward term and said summer;
   a second $1^{st}$ order feedback term connected between an input of said sigma delta modulator and said summer; and
   a third $1^{st}$ order feedback term connected between said second $1^{st}$ order feedback term and said summer;
   wherein said first $1^{st}$ order feedforward term and said second $1^{st}$ order feedforward term combine to provide a $1^{st}$ order feedforward term and a $2^{nd}$ order feedforward term; and
   wherein said second $1^{st}$ order feedback term and said third $1^{st}$ order feedback term combine to provide a $1^{st}$ order feedback term and a $2^{nd}$ order feedback term.

6. The $2^{nd}$ order digital filter according to claim 1, wherein:
   said $2^{nd}$ order digital filter is an IIR filter.

7. The $2^{nd}$ order digital filter according to claim 1, wherein:
   said $2^{nd}$ order digital filter is an IIR filter; and said digital filter achieves a $2^{nd}$ order filtering function requiring only one sigma delta modulator.

8. The $2^{nd}$ order digital filter according to claim 1, wherein:
   said $2^{nd}$ order digital filter is an FIR filter.

9. A method of providing a $2^{nd}$ or higher order digital filter using only one sigma delta modulator, comprising:
   generating a modulated signal with said only one sigma delta modulator;
   delaying a sample output from said sigma delta modulator for one filter cycle; and
   summing said delayed sample output from said one sigma delta modulator with an input signal to said sigma delta modulator;
   wherein a $2^{nd}$ order denominator portion of a transfer function is output by said one sigma delta modulator.

10. A method of providing a $2^{nd}$ or higher order digital filter using only one sigma delta modulator, comprising:
    generating a modulated signal with said only one sigma delta modulator;
    delaying a sample output from said sigma delta modulator for one filter cycle; and
    summing said delayed sample output from said one sigma delta modulator with an input signal to said sigma delta modulator;
    wherein a $2^{nd}$ order denominator portion of a transfer function is output by said one sigma delta modulator; and
    wherein said sigma delta modulator delays a sample for one filter cycle.

11. A method of providing a $2^{nd}$ or higher order digital filter using only one sigma delta modulator comprising:
    generating a modulated signal with said only one sigma delta modulator;
    delaying a sample output from said sigma delta modulator for one filter cycle; and
    summing said delayed sample output from said one sigma delta modulator with an input signal to said sigma delta modulator;
    delaying an input sample to said only one sigma delta filter for one filter cycle;
    delaying said delayed input sample for a second filter cycle; and
    inputting said twice delayed input sample to said only one sigma delta modulator;
    wherein a $2^{nd}$ order denominator portion of a transfer function is output by said one sigma delta modulator; and
    wherein a $2^{nd}$ order numerator portion of a transfer function is provided by said twice delayed input sample.

12. A method of providing a $2^{nd}$ or higher order digital filter using only one sigma delta modulator, comprising:
    generating a modulated signal with said only one sigma delta modulator;

delaying a sample output from said sigma delta modulator for one filter cycle; and summing said delayed sample output from said one sigma delta modulator with an input signal to said sigma delta modulator;

delaying an input sample to said only one sigma delta filter for one filter cycle;

delaying said delayed input sample for a second filter cycle;

inputting said twice delayed input sample to said only one sigma delta modulator; and inputting said once delayed input sample to said only one sigma delta modulator;

wherein a $2^{nd}$ order denominator portion of a transfer function is output by said one sigma delta modulator; and wherein a $2^{nd}$ order numerator portion of a transfer function is provided by said twice delayed input sample.

13. A method of providing a $2^{nd}$ or higher order digital filter using only one sigma delta modulator, comprising:

generating a modulated signal with said only one sigma delta modulator;

delaying a sample output from said sigma delta modulator for one filter cycle; and summing said delayed sample output from said one sigma delta modulator with an input signal to said sigma delta modulator;

delaying said input signal to said only one sigma delta modulator for a first filter cycle;

delaying said once delayed input signal for a second filter cycle; and summing said twice delayed input signal with said input to said only one sigma delta modulator;

wherein a $2^{nd}$ order denominator portion of a transfer function is output by said one sigma delta modulator.

14. A method of providing a $2^{nd}$ or higher order digital filter using only one sigma delta modulator, comprising:

generating a modulated signal with said only one sigma delta modulator;

delaying a sample output from said sigma delta modulator for one filter cycle;

summing said delayed sample output from said one sigma delta modulator with an input signal to said sigma delta modulator;

delaying said input signal to said only one sigma delta modulator for one filter cycle;

delaying said once delayed input signal for a second filter cycle; and summing said twice delayed input signal with said input to said only one sigma delta modulator;

wherein a $2^{nd}$ order denominator portion of a transfer function is output by said one sigma delta modulator.

15. Apparatus for providing a $2^{nd}$ or higher order digital filter using only one sigma delta modulator, comprising:

means for generating a modulated signal with one sigma delta modulator;

means for delaying a sample output from said sigma delta modulator for one filter cycle; and means for summing said delayed sample output from said one sigma delta modulator with an input signal to said sigma delta modulator;

wherein a $2^{nd}$ order denominator portion of a transfer function is output by said one sigma delta modulator.

16. The apparatus for providing a $2^{nd}$ or higher order digital filter using only one sigma delta modulator according to claim 15, wherein:

said sigma delta modulator delays a sample for one filter cycle.

17. Apparatus for providing a $2^{nd}$ or higher order digital filter using only one sigma delta modulator, comprising:

means for generating a modulated signal with one sigma delta modulator;

means for delaying a sample output from said sigma delta modulator for one filter cycle;

means for summing said delayed sample output from said one sigma delta modulator with an input signal to said sigma delta modulator;

means for delaying an input sample to said only one sigma delta filter for one filter cycle;

means for delaying said delayed input sample for a second filter cycle; and means for inputting said twice delayed input sample to said only one sigma delta modulator;

wherein a $2^{nd}$ order denominator portion of a transfer function is output by said one sigma delta modulator;

wherein a $2^{nd}$ order numerator portion of a transfer function is provided by said twice delayed input sample.

18. Apparatus for providing a $2^{nd}$ or higher order digital filter using only one sigma delta modulator, comprising:

means for generating a modulated signal with one sigma delta modulator;

means for delaying a sample output from said sigma delta modulator for one filter cycle;

means for summing said delayed sample output from said one sigma delta modulator with an input signal to said sigma delta modulator;

means for delaying an input sample to said only one sigma delta filter for one filter cycle;

means for delaying said delayed input sample for a second filter cycle;

means for inputting said twice delayed input sample to said only one sigma delta modulator; and means for inputting said once delayed input sample to said only one sigma delta modulator;

wherein a $2^{nd}$ order denominator portion of a transfer function is output by said one sigma delta modulator; and wherein a $2^{nd}$ order numerator portion of a transfer function is provided by said twice delayed input sample.

19. Apparatus for providing a $2^{nd}$ or higher order digital filter using only one sigma delta modulator, comprising:

means for generating a modulated signal with one sigma delta modulator;

means for delaying a sample output from said sigma delta modulator for one filter cycle;

means for summing said delayed sample output from said one sigma delta modulator with an input signal to said sigma delta modulator;

means for delaying said input signal to said only one sigma delta modulator for a first filter cycle;

means for delaying said once delayed input signal for a second filter cycle; and means for summing said twice delayed input signal with said input to said only one sigma delta modulator;

wherein a $2^{nd}$ order denominator portion of a transfer function is output by said one sigma delta modulator.

20. Apparatus for providing a $2^{nd}$ or higher order digital filter using only one sigma delta modulator, comprising:

means for generating a modulated signal with one sigma delta modulator;

means for delaying a sample output from said sigma delta modulator for one filter cycle;

means for summing said delayed sample output from said one sigma delta modulator with an input signal to said sigma delta modulator;

means for delaying said input signal to said only one sigma delta modulator for one filter cycle;

means for delaying said once delayed input signal for a second filter cycle; and means for summing said twice delayed input signal with said input to said only one sigma delta modulator;

wherein a $2^{nd}$ order denominator portion of a transfer function is output by said one sigma delta modulator.

* * * * *